(12) United States Patent
Takedomi et al.

(10) Patent No.: US 6,798,658 B2
(45) Date of Patent: Sep. 28, 2004

(54) HIGH VOLTAGE ELECTRICAL PACKAGING BOX STRUCTURE

(75) Inventors: Harumi Takedomi, Utsunomiya (JP); Kazuhiko Aitaka, Utsunomiya (JP); Osamu Hasegawa, Utsunomiya (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 53 days.

(21) Appl. No.: 10/291,315

(22) Filed: Nov. 8, 2002

(65) Prior Publication Data

US 2003/0095382 A1 May 22, 2003

(30) Foreign Application Priority Data

Nov. 16, 2001 (JP) ........................................ 2001-352315

(51) Int. Cl.⁷ ................................................ H05K 7/20
(52) U.S. Cl. ...................... 361/694; 180/68.5; 361/600; 361/679; 361/715; 361/708
(58) Field of Search ........................ 180/68.5; 429/100; 361/600, 679, 690, 694–695, 704–710, 712–713, 715–716

(56) References Cited

U.S. PATENT DOCUMENTS

| 4,756,415 A | | 7/1988 | Call |
| 5,343,360 A | * | 8/1994 | Sanwo ........................ 361/707 |
| 5,381,304 A | * | 1/1995 | Theroux et al. ............ 361/706 |
| 6,431,300 B1 | * | 8/2002 | Iwase ........................ 180/68.5 |

FOREIGN PATENT DOCUMENTS

| DE | 43 21 216 | 1/1995 |
| DE | 693 17 571 T2 | 11/1998 |
| EP | 0 662 253 B1 | 3/1998 |
| GB | 1 430 079 | 3/1976 |
| GB | 2 102 207 | 1/1983 |
| WO | WO 00/47029 | 8/2000 |

* cited by examiner

Primary Examiner—Gregory D. Thompson
(74) Attorney, Agent, or Firm—Merchant & Gould P.C.

(57) ABSTRACT

A high voltage electrical packaging box structure includes a box body, and a high voltage electrical part which is accommodated in the box body. In the high voltage electrical packaging box, an interposing member which is formed using an expandable resin, is disposed between the box body and the high voltage electric part. Air may be pass through the inside of the box body so as to cool down the high voltage electric part placed in the box body.

7 Claims, 13 Drawing Sheets

HIGH VOLTAGE ELECTRICAL PACKAGING BOX STRUCTURE

BACKGROUND OF THE INVENTION

1. Field of the Invention

The present invention relates to a high voltage electrical packaging box structure. More specifically, the present invention relates to a high voltage electrical packaging box structure for accommodating high voltage electric parts which may generate heat.

2. Description of Related Art

In electric vehicles or hybrid vehicles, in general, high voltage electric parts, such as batteries and control devices, are provided in the vehicle in high voltage electrical packaging boxes so as not to be exposed to the outside.

The inventors of the present invention considered, in order to efficiently locate the above-mentioned high voltage electrical packaging box in a vehicle, to locate the high voltage electrical packaging box along the backrest of the rear seat. When the high voltage electrical packaging box is placed near the passenger compartment of a vehicle, as in the case mentioned above, the electrical parts may be subject to adverse effects, such as shortened battery life, if the voltage is left under sunlight. Also, if the batteries are used at an excessively low temperature, an increase in the internal resistance may occur in association with freezing of electrolyte, and the output thereof may be lowered. That is, the excessively high or excessively low temperatures will adversely affect the high voltage electric parts including the batteries.

SUMMARY OF THE INVENTION

Accordingly, an object of the invention is to provide a high voltage electrical packaging box structure which can prevent adverse effects on the performance of high voltage electric parts at both high interior temperatures and low interior temperatures of a vehicle.

In order to achieve the above object, the present invention provides a high voltage electrical packaging box structure including a box body case member (for instance, a high voltage electrical packaging box body 70 in an embodiment described later), high voltage electric parts (for instance, a battery 5, an inverter 7, and a DC/DC converter 8 in the embodiment described later) which are accommodated in the box body, and an interposing member (for instance, interposing members 200–203 in the embodiment described later) which is formed using an expandable resin, the interposing member being disposed between the box body and the high voltage electric part.

According to the above high voltage electrical packaging box structure, since the interposing member, which is formed using an expandable resin, is disposed in a space between the box body and the high voltage electric part, it becomes possible to thermally insulate the high voltage electric part using the interposing member. Accordingly, adverse effects on the performance of the high voltage electric part may be prevented at both excessively high and low interior temperatures of the vehicle. Also, since the interposing member, which is formed using an expandable resin, is disposed at the outside of the high voltage electric part, it becomes possible to prevent the adverse effects of external impacts on the high voltage electric part.

In accordance with another aspect of the present invention, in the above high voltage electrical packaging box structure, air is passed through the box body so as to cool down the high voltage electric parts.

According to the above high voltage electrical packaging box structure, since the high voltage electric part is to be cooled down by air flowing inside the box body, the air can be efficiently passed along the high voltage electric part by filling the space between the box body and the high voltage electric part using the interposing member. Accordingly, it becomes possible to efficiently cool down the high voltage electric part In accordance with another aspect of the present invention, in the above high voltage electrical packaging box structure, a terminal portion of the high voltage electric part is covered by the interposing member.

According to the above high voltage electrical packaging box structure, since the terminal portion of the high voltage electric part is covered by the interposing member, which is made of an expandable resin, it becomes possible, if the interposing member is attached to the high voltage electric part side in advance, to prevent a worker from accidentally touching the terminal portion when the high voltage electric part is mounted or when performing maintenance. Accordingly, it becomes possible to improve the efficiency of the high voltage electric part mounting process or maintenance.

In accordance with yet another aspect of the present invention, the above high voltage electrical packaging box structure is placed between the rear seat and the trunk of a vehicle. Also, in accordance with yet another aspect of the present invention, the above high voltage electrical packaging box structure is applied to a cooling device.

According to the above high voltage electrical packaging box structure, since it is possible to efficiently place the cooling device, to which the high voltage electrical packaging box structure is applied, between the backrest of the rear seat and the trunk of the vehicle, it becomes possible to use the available space in the vehicle in an efficient manner. Also, when it becomes necessary to perform some work on the electronic parts accommodated in the case member of the high voltage electrical packaging cooling device, the back of the rear seat and the cover member may be removed in an efficient manner, and work may be performed on the electronic parts in the case member through the opening portion thereof.

BRIEF DESCRIPTION OF THE DRAWINGS

Some of the features and advantages of the invention have been described, and others will become apparent from the detailed description which follows and from the accompanying drawings, in which.

DETAILED DESCRIPTION OF THE INVENTION

The invention summarized above and defined by the enumerated claims may be better understood by referring to the following detailed description, which should be read with reference to the accompanying drawings. This detailed description of particular preferred embodiments, set out below to enable one to build and use particular implementations of the invention, is not intended to limit the enumerated claims, but to serve as particular examples thereof.

Hereinafter, a high voltage electrical packaging box structure according to an embodiment of the present invention will be described with reference to the attached drawings.

The high voltage electrical packaging box structure according to this embodiment is applied to a high voltage electrical packaging cooling device for a vehicle. Note that the vehicle used in this embodiment is a hybrid vehicle. In hybrid vehicles, direct current is converted into alternating current by an inverter when being supplied to a motor from a direct current power source battery. Also, when a part of the output from the engine or the kinetic energy is to be stored in the battery via a motor, alternating current is converted into direct current by an inverter. Moreover, since the voltage of the direct current converted by the inverter is high, voltage of a part of the electric power is reduced using a DC/DC converter. The high voltage electrical packaging cooling device is used to cool down the battery, the inverter, and the DC/DC converter.

Figure 1:
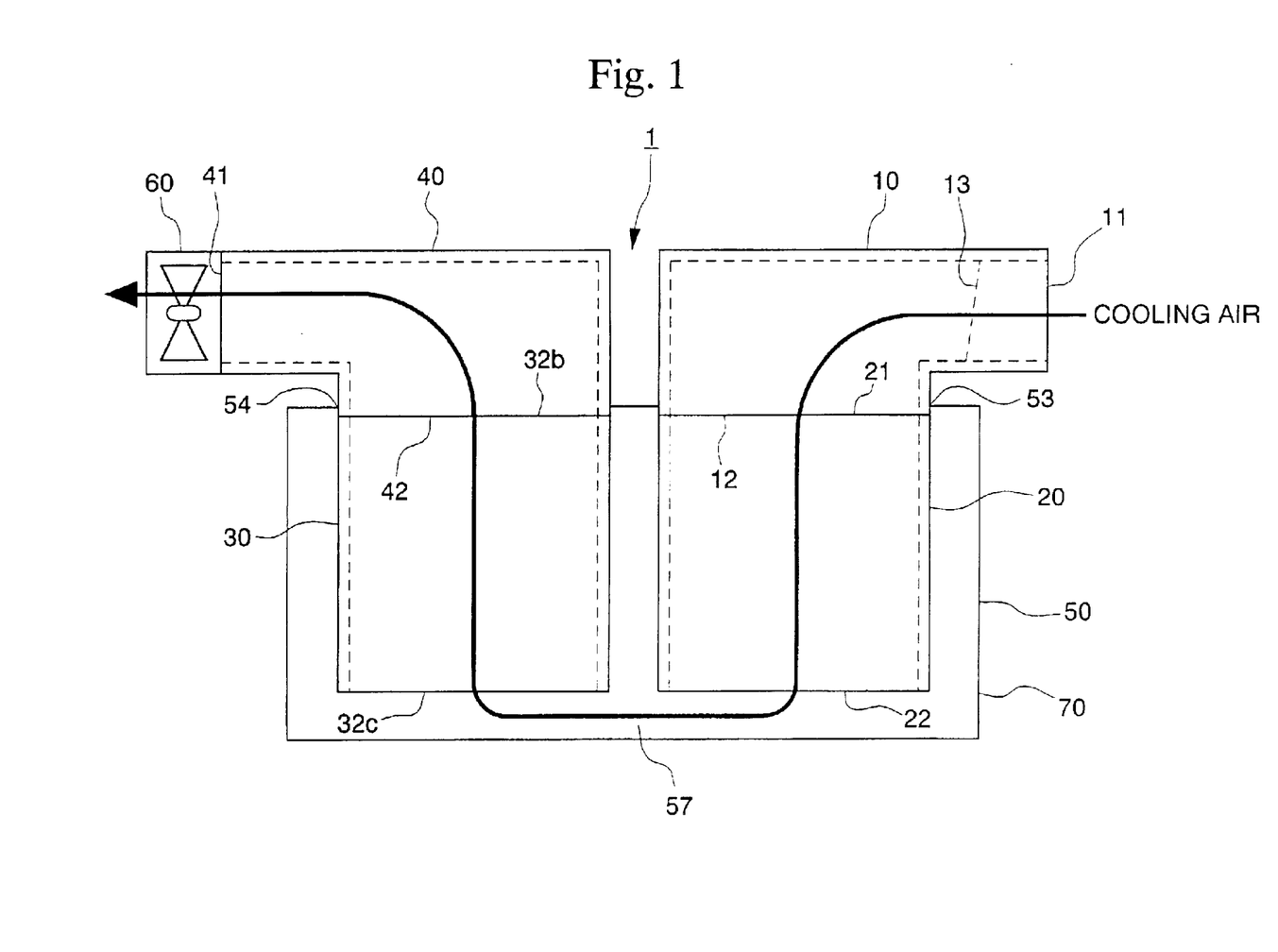
FIG. 1 is a schematic diagram showing a high voltage electrical packaging cooling device for a vehicle to which the high voltage electrical packaging box structure according to an embodiment of the present invention is applied.

Next, the high voltage electrical packaging cooling device 1 to which the high voltage electrical packaging box structure according to the embodiment of the present invention is applied will be explained with reference to FIG. 1.

The high voltage electrical packaging cooling device 1 includes an air-intake duct 10, a battery box 20, a heat sink case 30, an air-exhaust duct 40, an exterior box 50, and a fan 60. Also, a high voltage electrical packaging box body 70 is mainly formed by the battery box 20, the heat sink case 30, and the exterior box 50.

The air-intake duct 10 includes a cooling air inlet 11 which may be opened and closed by a shutter 13. The battery box 20, which has a box shape, includes an upper opening 21 that is connected to a lower opening 12 of the air-intake duct 10. A battery (not shown in FIG. 1), which is a high voltage electric part, is placed in the battery box 20 through which cooling air flows. The heat sink 30, which also has a box shape, includes an upper opening 32b that is connected to a lower opening 42 of the air-exhaust duct 40. A heat sink is disposed in the heat sink case 30 through which the cooling air flows. Also, an inverter (not shown in FIG. 1) and a DC/DC converter (not shown in FIG. 1), which are high voltage electric parts, are disposed outside the heat sink case 30. Note that the battery box 20 and the heat sink case 30 are located next to each other.

The battery box 20, the heat sink case 30, the inverter, and the DC/DC converter are surrounded by the exterior box 50. The exterior box 50 is a closed box having openings 53 and 54 at the upper portion thereof. The opening 53 is sealed with the joint portion of the lower opening 12 of the air-intake duct 10 and the upper opening 21 of the battery box 20 whereas the opening 54 is sealed with the joint portion of the lower opening 42 of the air-intake duct 40 and the upper opening 32b of the heat sink case 30. Also, a lower opening 22 of the battery box 20 and a lower opening 32c of the heat sink case 30 are communicated via the internal space of the exterior box 50.

The air-exhaust duct 40 includes a cooling air outlet 41, and a fan 60 is disposed at the cooling air outlet 41. Also, the operation of the fan 60 is connected with that of the shutter 13, and the shutter 13 opens when the fan 60 rotates, and closes when the fan 60 stops.

In the high voltage electrical packaging cooling device 1 including the above-mentioned configuration, the shutter 13 opens when the fan 60 rotates so that cooling air is introduced into the air-intake duct 10 via the cooling air inlet 11. The cooling air introduced into the air-intake duct 10 is exhausted to the outside of the exterior box 50 through the battery box 20. When the cooling air passes through the battery box 20, it exchanges heat with the battery, and as a result, the battery is cooled. The cooling air, the temperature of which is somewhat increased, passes into the exterior box 50. Note that since the battery is controlled so as to maintain a low temperature, the temperature of the cooling air after passing into the exterior box 50 is still sufficiently low to cool down the inverter and the DC/DC converter.

Since the exterior box 50 is a closed box, the cooling air passing into the exterior box 50 is introduced into the heat sink case 30. That is, the inside of the exterior box 50 functions as a cooling air passage 57 through which the cooling air is introduced to the inverter after cooling the battery. The cooling air introduced into the heat sink case 30 is then introduced to the air-exhaust duct 40 passing through the inside of the heat sink case 30, and then exhausted to the outside via the cooling air outlet 41 by the operation of the fan 60. The cooling air exchanges heat with the heat sink when it passes through the inside of the heat sink case 30. Since the heat of the inverter and of the DC/DC converter is transmitted to the heat sink via the heat sink case 30, the inverter and the DC/DC converter are cooled down by heat exchange between the cooling air and the heat sink.

Next, a high voltage electrical packaging cooling device to which the high voltage electrical packaging box structure according to the embodiment of the present invention is applied will be explained in detail with reference to FIGS. 2 through 10. Note that in FIGS. 2 through 10, elements which are the same as those in FIG. 1 are indicated by the sane numerals.

Figure 7:
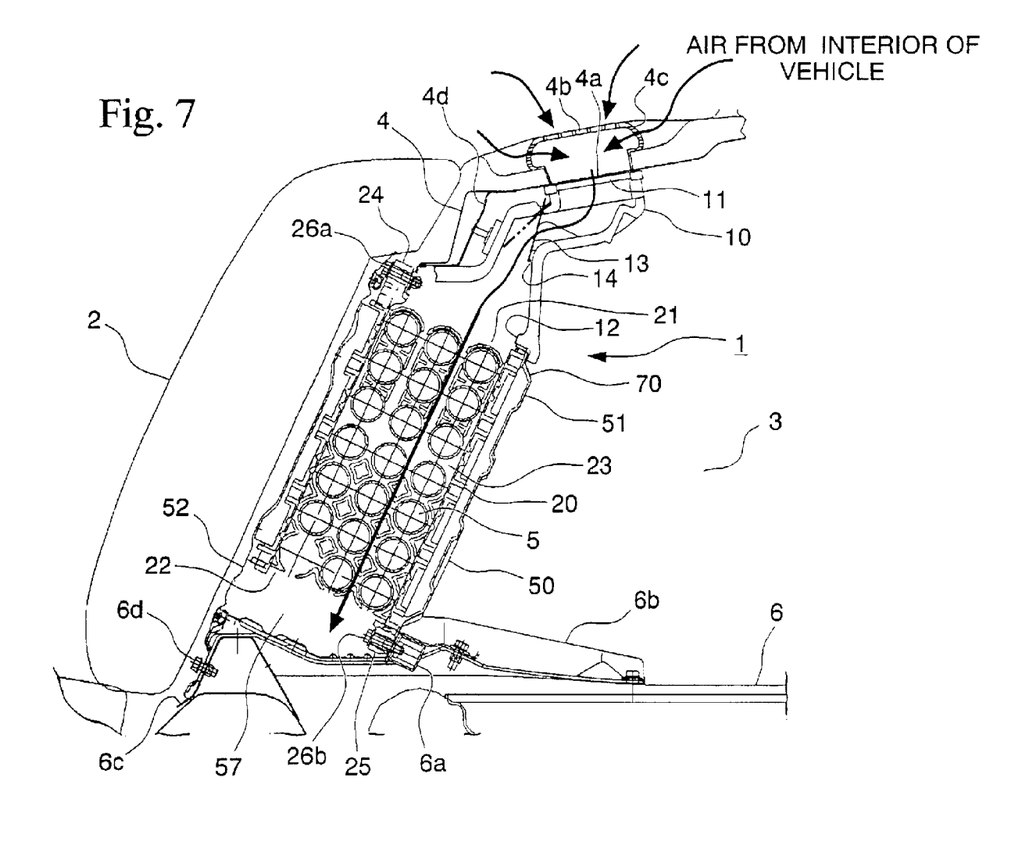
FIG. 7 is a cross-sectional view showing a battery accommodated in the high voltage electrical packaging cooling device in a longitudinal direction.
Figure 9:
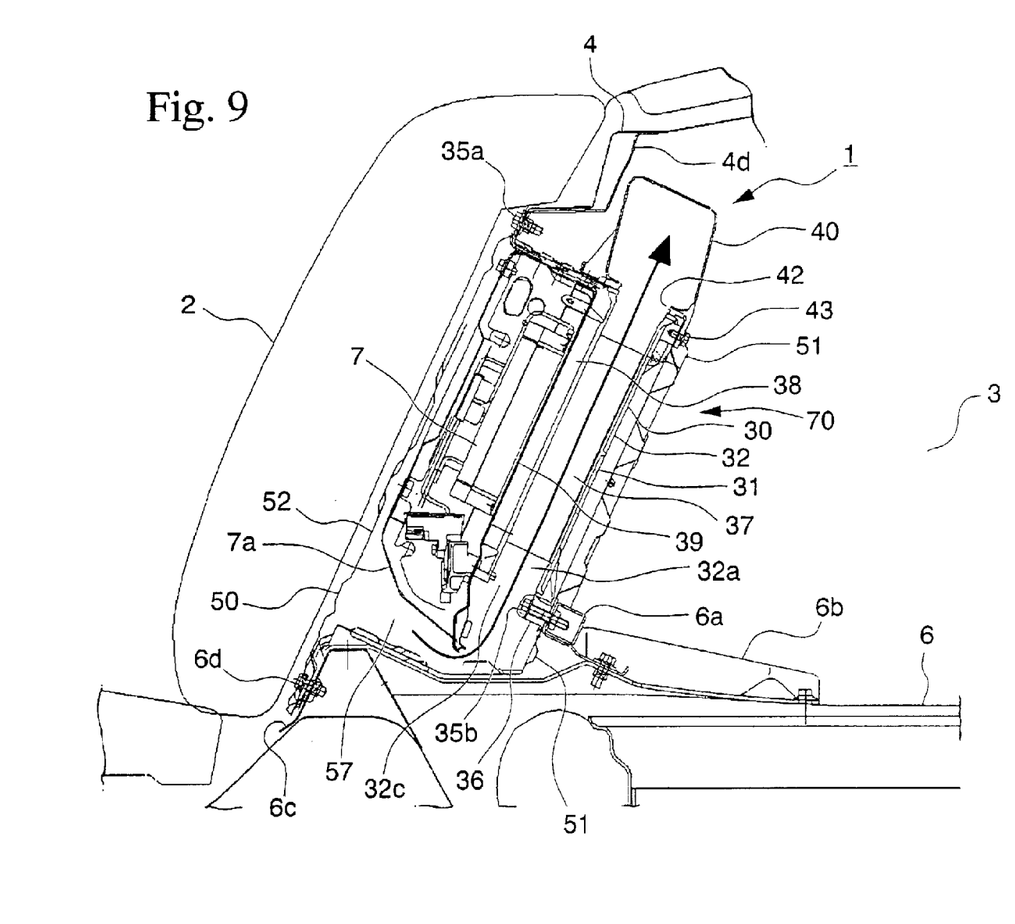
FIG. 9 is a cross-sectional view showing an inverter accommodated in the high voltage electrical packaging cooling device in the longitudinal direction.

The high voltage electrical packaging cooling device 1, as shown in FIGS. 7 and 9, is placed between the rear seat 2 and the trunk 3 in a standing state with its upper portion inclined towards the trunk 3 to some extent so as to fit with the backrest of the rear seat 2.

The high voltage electrical packaging cooling device 1 includes the air-intake duct 10, the battery box 20, the heat sink case 30, the air-exhaust duct 40, the exterior box 50, the fan 60, and interposing members 200–203. Here, the high voltage electrical packaging box body 70 is formed by the battery box 20, the heat sink case 30, and the exterior box 50.

The air-intake duct 10 may be formed of an expandable resin, such as expandable polypropylene, which is light and has good heat insulating properties.

Figure 2:
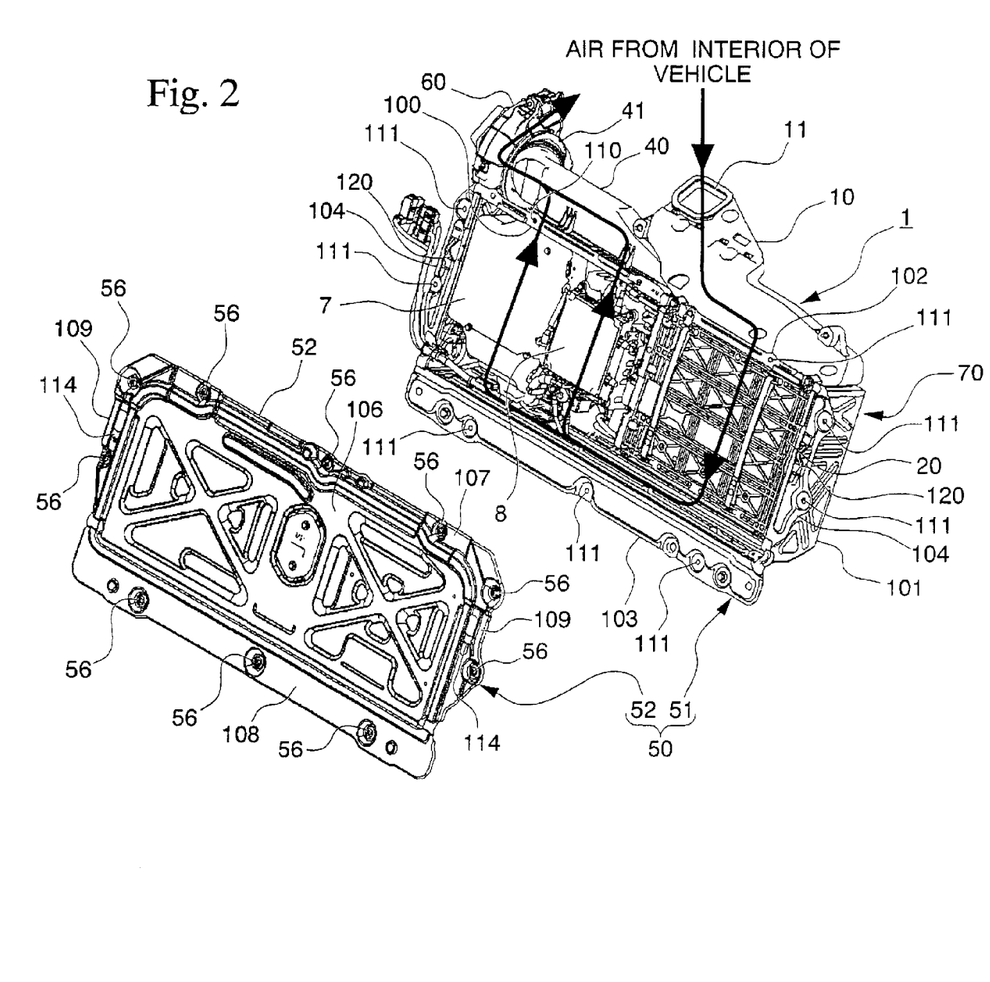
FIG. 2 is an exploded perspective view showing the high voltage electrical packaging cooling device from the front of a vehicle.

As shown in FIGS. 2 and 7, the cooling air inlet 11 is formed at the upper end portion of the air-intake duct 10, and the lower opening 12, which is oblong and larger than the cooling air inlet 11, is formed at the lower end portion of the air-intake duct 10.

The cooling air inlet 11 of the air-intake duct 10 is connected to a suction grill 4b via an opening 4a formed in the rear tray 4 of the vehicle. The suction grill 4b includes a number of suction openings 4c at the upper and side surfaces thereof which are exposed to the interior of the vehicle so that air in the vehicle may be introduced into the air-intake duct 10 through the openings 4c. Note that since the suction openings 4c are provided at the side surfaces as well as the upper surface thereof, the air in the vehicle can be introduced into the air-intake duct 10 even if the openings at the upper surface are closed by an object put on the suction grill 4b.

Also, the shutter 13 is disposed in the air-intake duct 10 in the vicinity of the cooling air inlet 11. The shutter 13, which may be made of an ethylene-propylene rubber (EPDM), is rotatably disposed with its upper portion as its center of rotation. The shutter 13 generally hangs down due to its weight, and as indicated by the solid line in FIG. 7, it closes the cooling air passage by contacting a valve seat 14 which is disposed in the middle of the air-intake duct 10. When a negative pressure is generated downstream of the shutter 13, the shutter 13 rotates upwardly as indicated by the dotted line, and separates from the valve seat 14, and the cooling air passage is opened.

Figure 6:
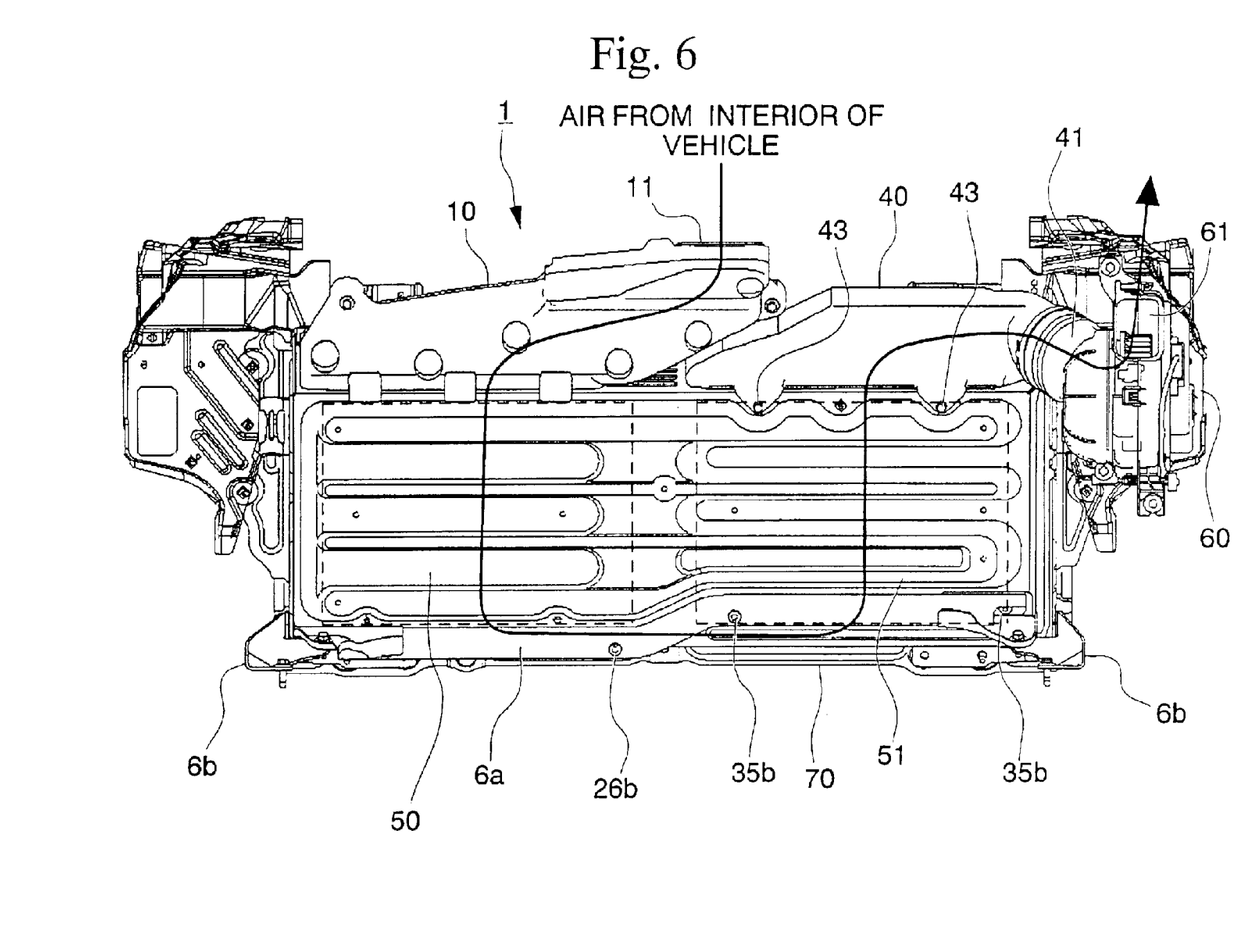
FIG. 6 is a back elevational view showing the high voltage electrical packaging cooling device from the rear of the vehicle.

As shown in FIGS. 2, 6, and 9, the air-exhaust duct 40 includes the cooling air outlet 41 at an upper rear portion, and two lower openings 42 at a lower end portion thereof. The fan 60 for exhausting the cooling air in the air-exhaust duct 40 is disposed at the cooling air outlet 41, and the cooling air from the outlet 61 of the fan 60 is exhausted to the trunk 3 via a duct which is not shown in the figures.

The air-intake duct 10 and the air-exhaust duct 40 communicate via a cooling air passage formed by the battery box 20, the heat sink case 30, and the exterior box 50.

Figure 3:
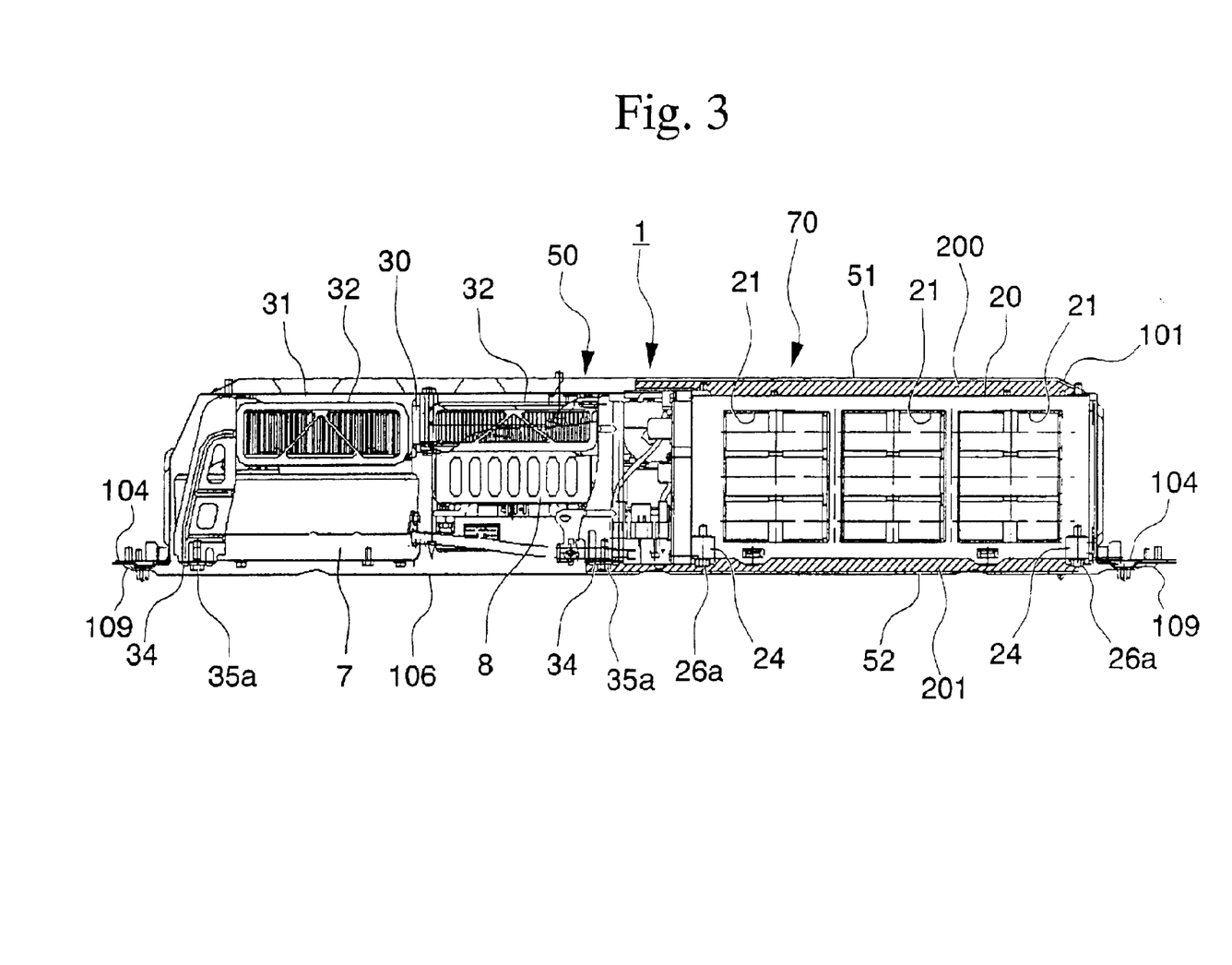
FIG. 3 is a cross-sectional view showing the high voltage electrical packaging cooling device in a transverse direction.
Figure 4:
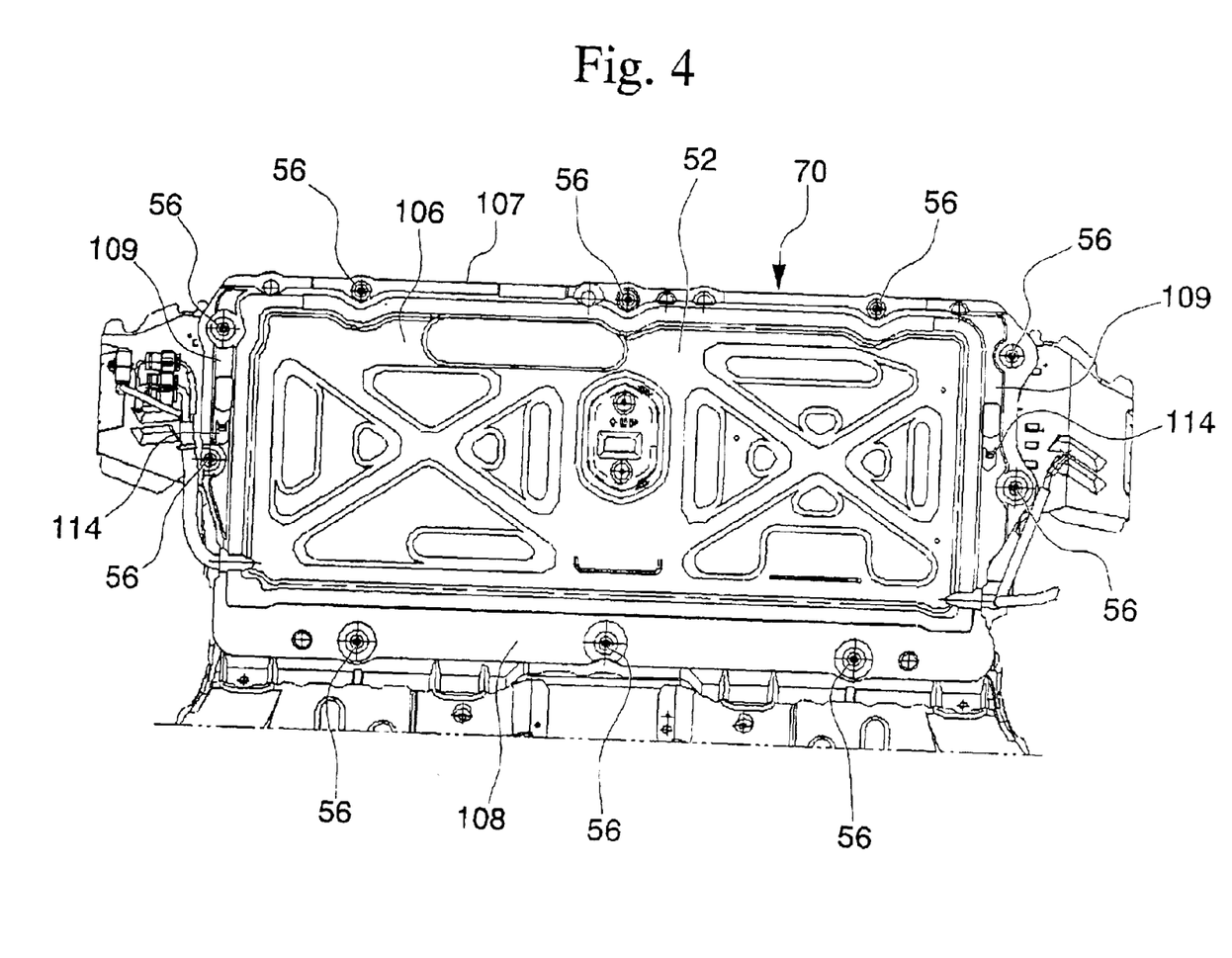
FIG. 4 is an elevational view showing the high voltage electrical packaging cooling device from the front side of the vehicle.

The battery box 20 may be formed of a material which is light and has high rigidity, such as fiber reinforced plastics (FRP). As shown in FIGS. 3, and 7, the battery box 20 has a box shape including a plurality of upper openings 21 and lower openings 22 at the upper and the lower sides thereof. The internal space 23 of the battery box 20 functions as a passage for the cooling air as well as a space for accommodating a number of batteries 5. The cooling air flows into the internal space 23 of the battery box 20 from the upper openings 21, and exchanges heat with the batteries 5 while passing between the batteries 5. Then, the cooling air is exhausted to the outside of the battery box 20 via the lower openings 22.

Figure 8:
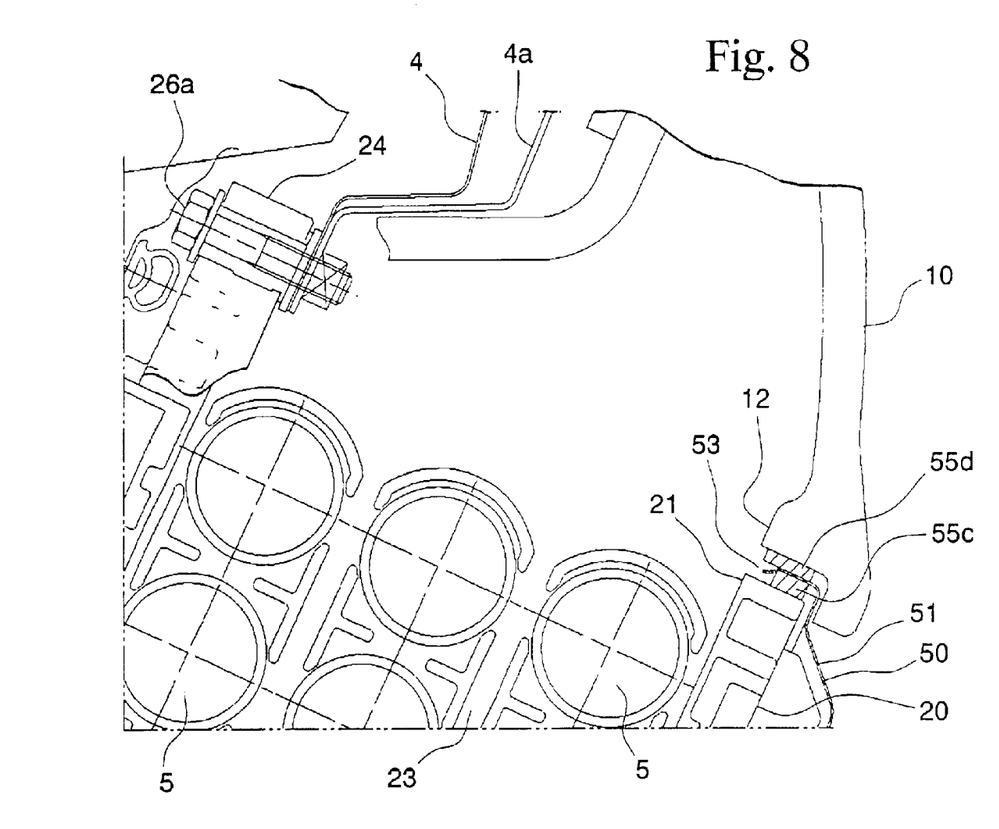
FIG. 8 is an enlarged view showing the main portions of FIG. 7.

Also, a pair of fixing bosses 24 and 25 is disposed at the upper front portion and the rear back portion of the battery box 20. As shown in FIGS. 7 and 8, the two fixing bosses 24 and 24 located above are fixed to the rear tray 4 and a reinforcing member 4d by a bolt 26a. The two fixing bosses 25 and 25 located below are, as shown in FIGS. 6 and 7, fixed to a pipe frame 6a disposed in the trunk 3 along the width of the body by a bolt 26b. The pipe frame 6a is fixed between a pair of side frames 6b and 6b, which are fixed to the right hand side and the left hand side of a vehicle floor 6 in the trunk 3, so as to be located slightly above the vehicle floor 6. As a result, two portions at the upper front side and two portions at the lower back side of the battery box 20 are fixed to the body of the vehicle and are firmly supported.

Figure 10:
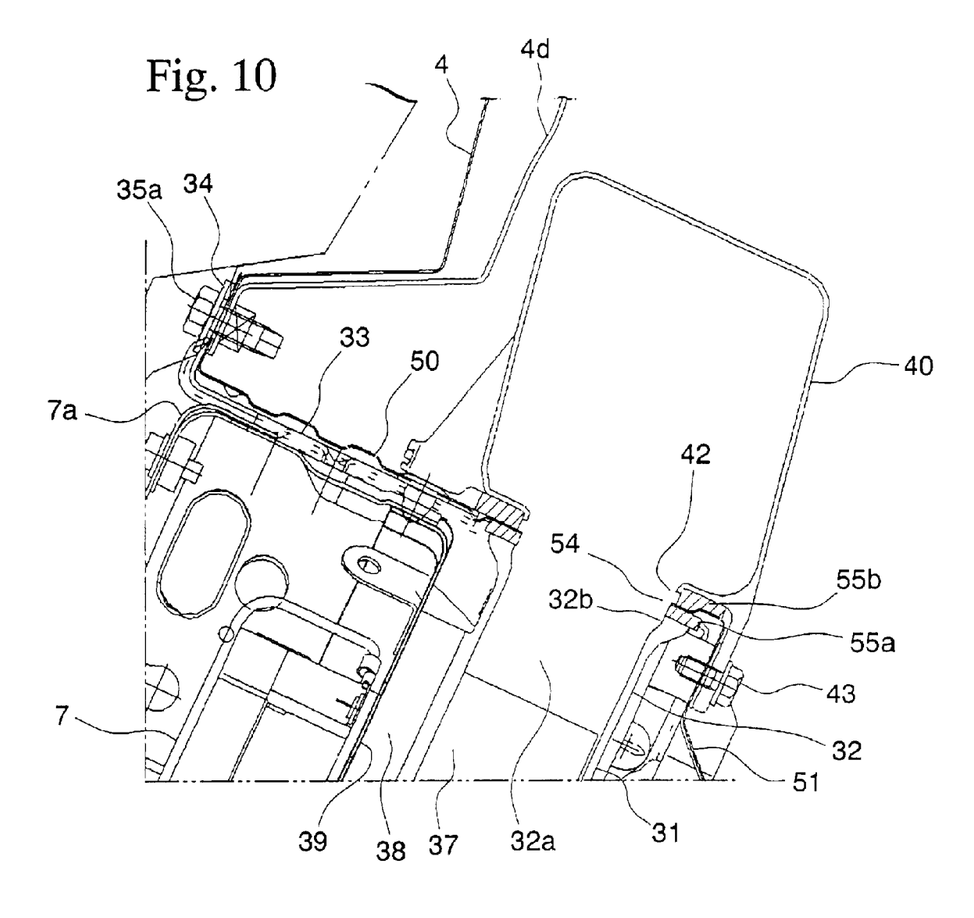
FIG. 10 is an enlarged view showing the main portions in FIG. 9.

The heat sink case 30 may be made of a material having a light weight and high rigidity, such as magnesium. As shown in FIGS. 3, 9, and 10, the heat sink case 30 includes a main body 31 formed by two box shaped casings 32 and 32, which extend in the up and down direction and are integrally coupled being disposed parallel to each other at the right and left hand sides of the heat sink case 30. The rear surface of the main body 31 is disposed on substantially the same plane of the rear surface of the battery box 20. Arms 33 are extended in the front direction from both sides of the upper front portion of the main body 31, and the end portion of each of the arms 33 bend upwardly to be used as fixing flanges 34. The front surface of the fixing flanges 34 is disposed on substantially the same plane as the front surface of the fixing boss 24 used for the battery box 20, and the fixing flanges 34 are fixed to the above-mentioned rear tray 4 and the reinforcing member 4a thereof by a bolt 35a. Also, fixing bosses 36 are disposed at both ends of the lower back side of the main body 31, and the fixing bosses 36 are fixed to the pipe frame 6a mentioned above by bolts 35b. As a result, two portions at the upper front side and two portions at the lower back side of the heat sink case 30 are fixed to the body of the vehicle and firmly supported.

The internal space 32a in each of the casings 32 and 32 functions as a passage for the cooling air. Also, a number of radiation plates (heat sinks) 37 which protrude from the inner wall surface of a heat transfer base 38 and extend in the up and down direction are disposed in the space 32a of each of the casings 32. The heat transfer base 38 is disposed outside of the front of the main body 31 where the radiation plates 37 are placed, and a tray 39 which covers substantially the entire front portion of the main body 31 is fixed to the heat transfer base 38. The upper end of the tray 39 is disposed inside the arm 33, and the lower end of the tray 39 extends downwardly with respect to the main body 31.

Figure 5:
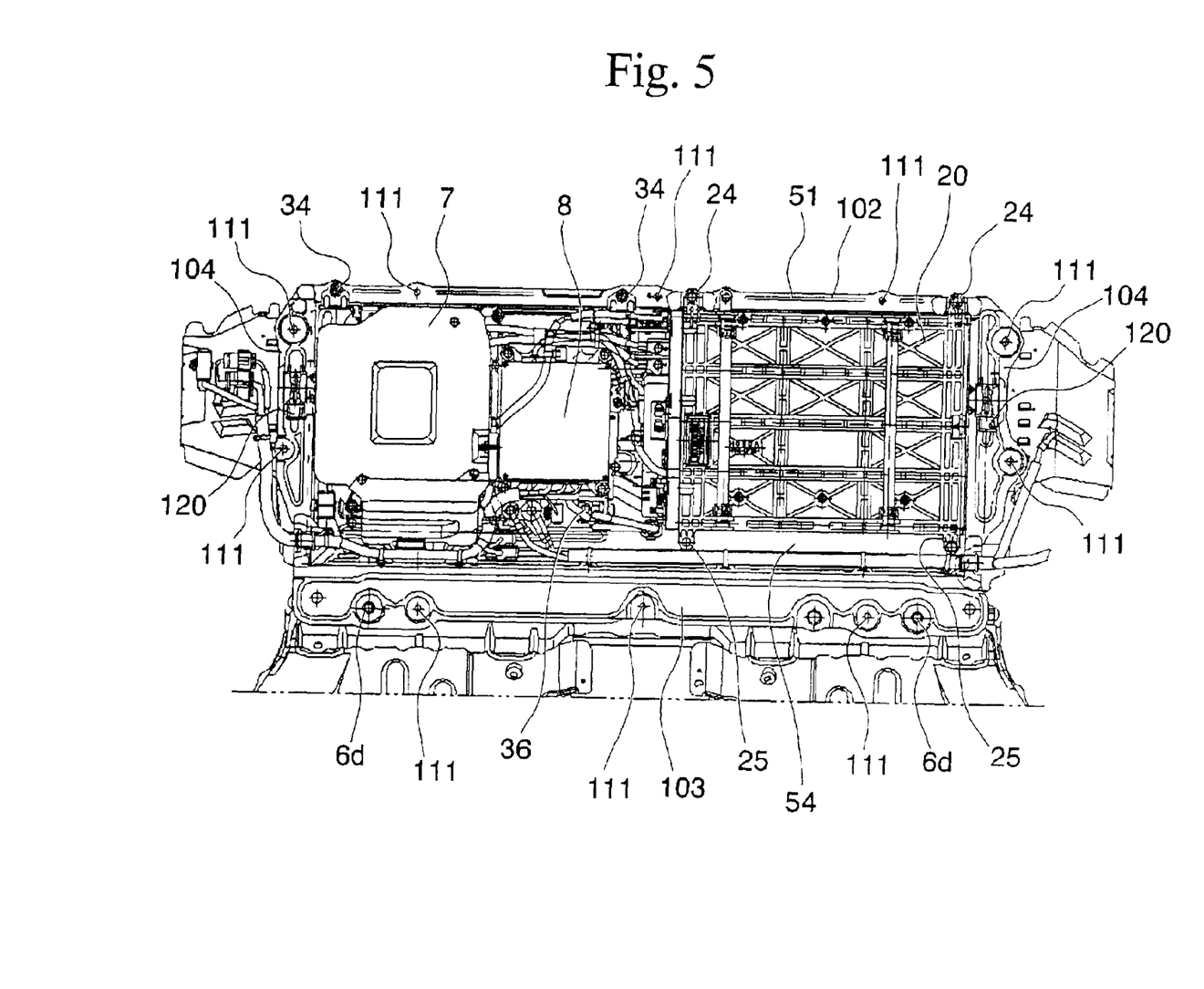
FIG. 5 is an elevational view showing the structure of the high voltage electrical packaging cooling device from which a part has been removed, viewed from the front side of the vehicle.

As shown in FIGS. 3 and 5, an inverter 7, which converts alternating current into direct current, is attached to the tray 39. A DC/DC converter 8 lowers the voltage of the direct current converted by the inverter 7. Note that in FIG. 9, the symbol 7a indicates a hood, which is attached to the inverter 7 to cover the inverter 7. The periphery of the hood 7a is engaged with the outside portion of the tray 39, and the inverter 7 is surrounded by the tray 39 and the hood 7a. The DC/DC converter 8 is also provided with another hood having the same function and the structure as the hood 7a. In the heat sink case 30 having the above-mentioned configuration, heat generated by the inverter 7 and the DC/DC converter 8 is transmitted to the radiation plates 37 via the heat transfer base 38. Then, heat is exchanged between the cooling air, which flows through the internal space 32a of the casing 32, and the radiation plates 37.

The exterior box 50 having a box shape may be made of a thin metal, and it may contain the battery box 20, the heat sink case 30, the inverter 7, the DC/DC converter 8, an electrical control unit (ECU), and so forth.

As shown in FIG. 2, the exterior box 50 which forms a part of the high voltage electrical packaging box body 70 includes a case member 51 having a rectangular solid shape having a rectangular opening portion 100 on a surface thereof, and a cover member 52 which is detachably attached to the case member 51 so as to cover the opening portion 100.

The case member 51 is disposed in an inclined state with respect to the horizontal plane so that the opening portion 100 faces the rear seat 2 and that the case member 51 inclines along the back of the rear seat 2. The case member 51 includes a case main portion 101, an upper flange portion 102, a lower flange portion 103, and a pair of side flange portions 104. The case main portion 101 has a substantially rectangular solid shape and includes the above-mentioned rectangular opening portion 100 which entirely opens one surface thereof. The upper flange portion 102 extends upwardly from an upper periphery of the case main portion 101 at the opening portion 100 side. The lower flange portion 103 extends downwardly from a lower periphery of the case main portion 101 at the opening portion 100 side. Each of the pair of the side flange portions 104 extends from a respective side periphery of the case main portion 101 at the opening portion 100 side.

An opening 53, which has the same shape and size as the upper opening 21, is formed on the upper surface of the case member 51 at a position corresponding to the upper opening 21 of the battery box 20 (refer to FIG. 8). Also, an opening 54, which has the same shape and size as the upper opening 32b, is formed on the upper surface of the case member 51 at a position corresponding to the upper opening 32b of each of the casings 32 of the heat sink case 30 (refer to FIG. 10).

As shown in FIG. 10, the periphery of the opening 54 of the case member 51 is positioned on the periphery of the upper opening 32b of the casing 32 via a sealing member 55a. Also, the periphery of the lower opening 42 of the air-exhaust duct 40 is positioned on the periphery of the opening 54 of the case member 51 via a sealing member 55b. The air-exhaust duct 40 is fixed to the case member 51 using bolts 43 so as to seal and connect the upper opening 32b of the heat sink case 30, the opening 54 of the case member 51, and the lower opening 42 of the air-exhaust duct 40.

On the other hand, as shown in FIG. 8, the periphery of the opening 53 of the case member 51 is positioned on the periphery of the upper opening 21 of the battery box 20 via a sealing member 55c. Also, the periphery of the lower opening 12 of the air-intake duct 10 is positioned on the periphery of the opening 53 of the case member 51 via a sealing member 55d. The air-intake duct 10 is fixed to the battery box 20 using a fixing means not shown in the figure so as to seal and connect the upper opening 21 of the battery box 20, the opening 53 of the case member 51, and the lower opening 12 of the air-intake duct 10.

As shown in FIGS. 7 and 9, the case member 51 is tightly sandwiched between the above-mentioned joint portion of the fixing boss 25 below the battery box 20 and the pipe frame 6a, and the joint portion of the fixing boss 36 of the heat sink case 30 and the pipe frame 6a. Also, the lower flange portion 103 of the case member 51 is fixed to a support flame 6c, which is disposed along the width direction of the vehicle floor 6, using a bolt 6d.

As shown in FIG. 2, the cover member 52 of the exterior box 50 includes a cover portion 106 at the center, an upper flange portion 107, a lower flange portion 108, and a pair of side flange portions 109. The upper flange portion 107 extends upwardly from the upper periphery of the cover portion 106. The lower flange portion 108 extends downwardly from the lower periphery of the cover portion 106. The pair of side flange portions 109 extend laterally from side peripheries of the cover portion 106. The cover member 52 covers the opening portion 100 of the case member 51 by the cover portion 106 thereof. Also, the cover member 52 is attached to the case member 51 so that the upper flange portion 107 thereof is engaged with the upper flange portion 102 of the case member 51, the lower flange portion 108 is engaged with the lower flange portion 103, and the side flange portions 109 are engaged with the side flange portions 104.

A screw hole 111 is formed at a predetermined position of each flange portion 102–104 of the case member 51, and a fixing hole which is not shown in the figure is formed in each of the flange portions 107–109 of the cover member 52 at a position corresponding to the screw hole 111.

Also, a pawl member 114 is provided with each of the pair of the side flange portions 109 of the cover member 52 at a predetermined position located at substantially the center in the height direction.

A receiving member 120 which is engaged with the pawl member 114 is provided with each of the pair of the side flange portions 104 of the case member 51 at a predetermined position located at substantially the center in the height direction thereof. The receiving member 120 may be formed by being partially punched out from the side flange portion 104 by a press working process and being partially raised upwardly.

Figure 11:
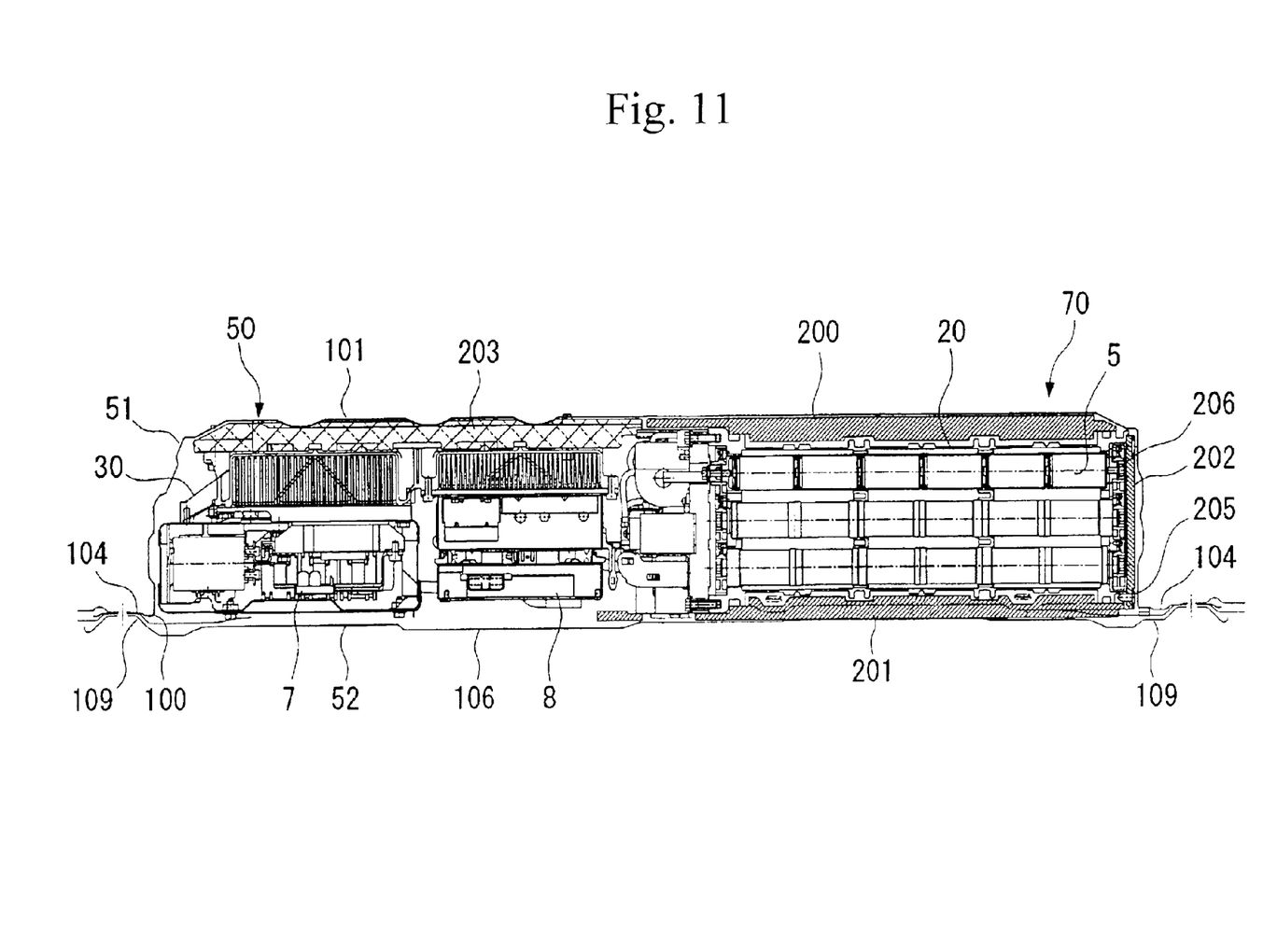
FIG. 11 is a cross-sectional view showing the high voltage electrical packaging cooling device.

In this embodiment, as shown in FIG. 11, plate-like interposing members 200–202, which may be formed using an expandable resin, such as expandable polypropylene, having light weight and good heat insulating properties, are interposed within the space between the high voltage electrical packaging box body 70 and the exterior box 50 and the battery box 20, i.e., the batteries 5. That is, the interposing member 200 is placed between the battery box 20 and the bottom surface of the case main portion 101 of the case member 51, which forms a part of the exterior box 50, so as to fill the space therebetween. Also, the interposing member 201 is placed between the battery box 20 and the cover portion 106 of the cover member 52, which forms a part of the exterior box 50 so as to fill the space therebetween. Moreover, the interposing member 202 is placed between the battery box 20 and the case member 51, at a position opposite the heat sink case 30 so as to fill the space therebetween.

Also, a plate-like interposing member 203, which may be formed using an expandable resin, such as expandable polypropylene, having light weight and good heat insulating properties is interposed between the exterior box 50 and the heat sink case 30. That is, the interposing member 203 is placed between the heat sink case 30 and the bottom surface of the case main portion 101 of the case member 51 so as to fill the space therebetween.

The interposing members 200 and 203, which are disposed at the bottom side of the case main body 101 of the case member 51, are attached to the case member 51 by a plurality of attaching members, such as resin clips, which are not shown in the figures. The interposing members 200 and 203 are placed in the case member 51 before the battery box 20 and the heat sink case 30 are accommodated in the case member 51. Also, since the interposing members 200 and 203 are disposed at the bottom side of the case main portion 101, the members 200 and 203 are disposed at the trunk side of the case member 51. Note that the outside of the bottom portion of the case main body 101 faces towards the trunk side, and an interior member, which is not shown in the figure, is attached to the outside thereof.

Also, the interposing member 201, which is disposed at the cover member 52 side, is attached to the cover member 52 using a plurality of attaching members, such as resin clips, which are not shown in the figures. The interposing member 201 is also attached to the cover member 52 before the cover member 52 is attached to the case member 51.

Moreover, the interposing member 202, which is disposed at the side of the battery box 20 opposite the heat sink case 30, is attached to the battery box 20 using a plurality of attaching members 205 (only one is shown in FIG. 11), such as resin clips. The interposing member 202 is attached to the battery box 20 before the battery box 20 is accommodated in the case member 51. Note that a terminal portion 206 of the battery 5 is provided at the side of the battery box 20 at which the interposing member 202 is disposed, and the interposing member 202 is attached to the battery box 20 so as to cover the terminal portion 206.

Figure 12:
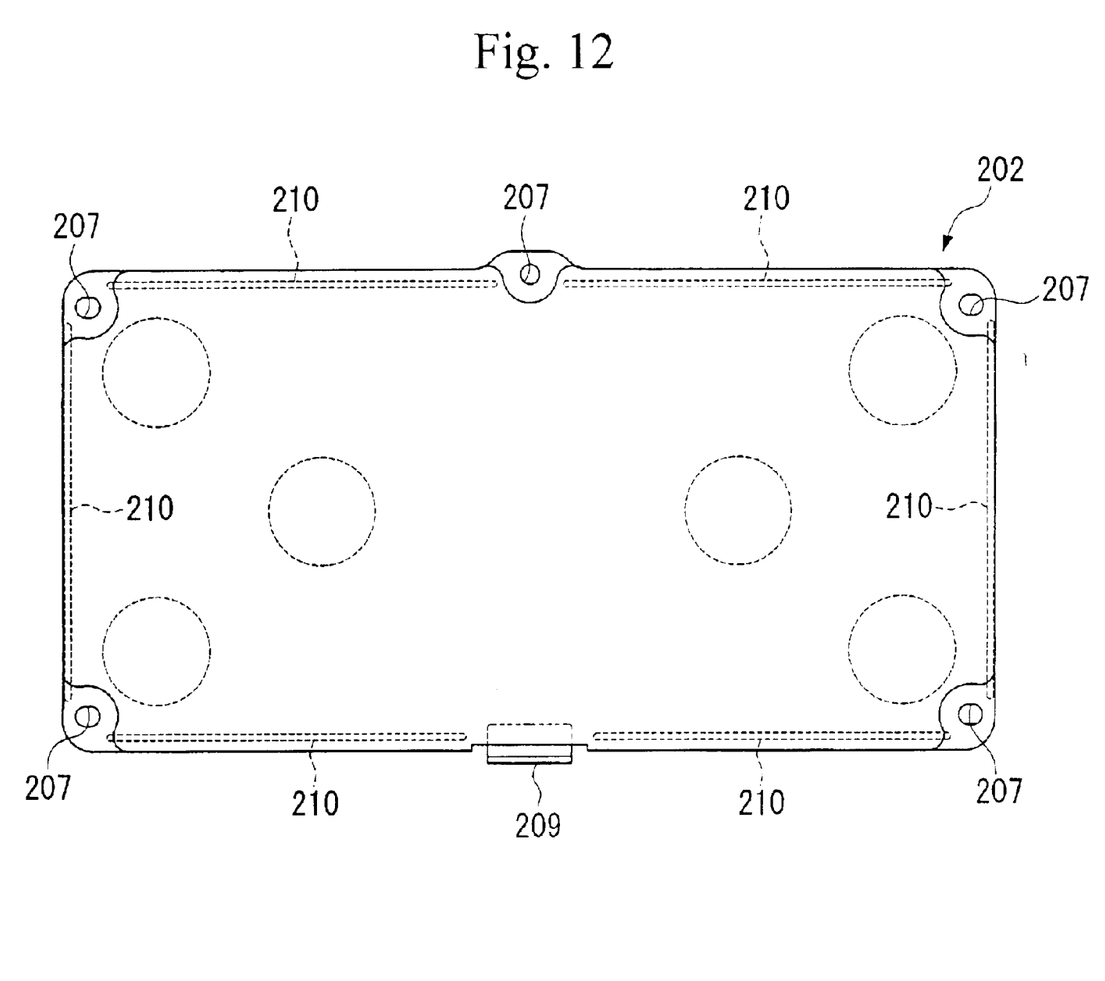
FIG. 12 is an elevational view showing an interposing member used for the high voltage electrical packaging box structure according to the embodiment of the present invention.
Figure 13:
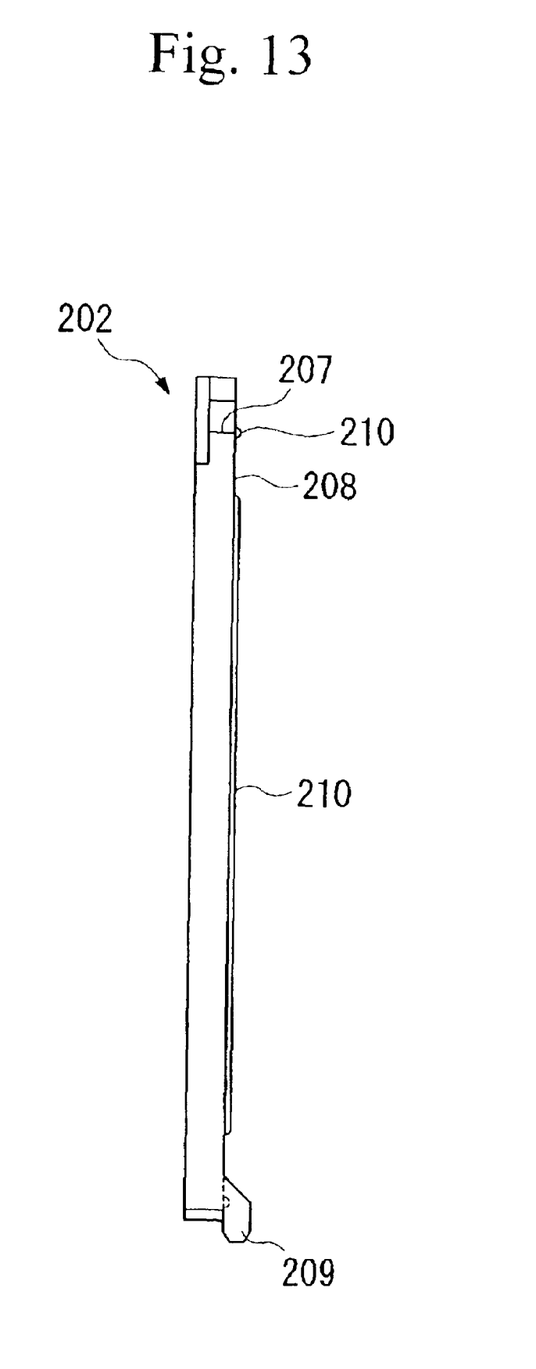
FIG. 13 is a side cross-sectional view of the interposing member used for the high voltage electrical packaging box structure according to the embodiment of the present invention.

As shown in FIGS. 12 and 13, the interposing member 202, which is attached to the battery box 20, is a rectangular plate shaped integrally formed member. The interposing member 202 includes fixing holes 207 for inserting the attaching members 205 disposed at four corners and at a center portion of one long side thereof. Also, at a center portion of the other long side of the interposing member 202, a projection portion 209 used for an attachment to the battery box 20 is provided, which projects from a plane portion 208 facing the battery box 20, and extends in a side direction along the plane portion 208. In addition, bead members 210 are formed on the plane portion 208 opposite the battery box 20, raised to form rib shapes, from a position slightly inward from each edge of the plane portion 208 and parallel with respect to the corresponding edge portion. The bead members 210 function so as to prevent cambering of the interposing member 202.

After the projection portion 209 is inserted into the hole of the battery box 20, which is not shown in the figure, in an inclined state with respect to the battery box 20, the interposing member 202 is pressed down into a position near the battery box 20, and is fixed to the battery box 20 by attaching the attaching member 205 through the five fixing holes 207. At that time, the interposing member 202 covers the terminal portion 206 of the battery 5, and each bead member 210 contacts the battery box 20 to seal the space between the interposing member 202 and the battery box 20.

As explained above, the interposing members 200 and 203 are attached to the case member 51 in advance, and the battery box 20, to which the battery 5, the interposing member 202, etc., are attached, and the heat sink case 30, to which members such as the inverter 7, the DC/DC converter 8, etc., are attached, are disposed in the case member 51 thereafter.

Then, the cover member 52, to which the interposing member 201 has been attached, is attached to the case member 51 so as to cover the opening portion 100 of the case member 51. At that time, in a state wherein a sealing member (not shown in the figure) having elasticity formed by, for instance, an EPDM rubber, is placed between the periphery of the opening portion 100 of the case member 51 and the cover member 52, the pawl member 114, which is formed on the side flange portions 109 of the cover member 52 is engaged with the receiving member 120, which is formed on the side flange portions 104 of the case member 51 while the sealing member 127 is compressed to temporarily fix the cover member 52 to the case member 51. After this, a screw 56 is inserted into the fixing hole (not shown in the figures) of the cover member 52 and is screwed into the screw hole 111 of the case member 51 to attach the cover member 52 to the case member 51.

In the exterior box 50, which is formed by the case member 51 and the cover member 52 attached to the case member 51 as explained above, the lower end of the battery box 20 is separated from the inner bottom surface of the exterior box 50 (refer to FIG. 7), and the lower end of the tray 39 provided with the heat sink case 30 and the lower end of the main body 31 of the heat sink case 30 are also separated from the inner bottom surface of the exterior box 50 (refer to FIG. 9). Also, the internal space of the closed exterior box 50 functions as the cooling air passage 57 which connects the lower opening 22 of the battery box 20 with the lower opening 32c of the casings 32 of the heat sink case 30.

In the high voltage electrical packaging cooling device 1 having the above-mentioned configuration, since the pressure inside the air-intake duct 10 becomes negative when the fan 60 is rotated, the shutter 13 rotates upwardly and separates from the valve seat 14 to open the passage for the cooling air. As a result, air inside the vehicle flows into the air-intake duct 10 as cooling air from the suction openings 4c of the suction grill 4b. The cooling air then flows into the internal space 23 of the battery box 20 from the lower opening 12 of the air-intake duct 10 via the upper opening 21 of the battery box 20, and further flows downwardly between the batteries 5 placed in the internal space 23. At that time, the cooling air (from the interior of the vehicle) flows through the internal space 23 exchanging heat with the batteries 5, and as a result, the batteries 5 are cooled down whereas the temperature of the cooling air is increased to some extent. Since the batteries 5 are controlled to maintain a low temperature, the degree of the increase in the temperature of the cooling air is small, and the air can still sufficiently cool down the inverter 7 and the DC/DC converter 8. Note that since the space between the exterior box 50 and the battery box 20 is filled by the interposing members 200–202, the amount of cooling air flow between the space can be significantly decreased, and hence it becomes possible to efficiently cool down the battery 5. The cooling air used for cooling down the batteries 5 is exhausted into the exterior box 50 from the lower opening 22 of the battery box 20.

Since the exterior box 50 is closed and the cooling air can flow through only the internal space 32a of the casings 32 of the heat sink case 30, the cooling air emitted into the exterior box 50 from the battery box 20 passes through the cooling air passage 57 and flows into the internal space 32a of the casings 32 via the lower opening 32c of the casings 32. Then, the cooling air ascends in the internal space 32a passing through the radiation plates 37. At this time, heat is exchanged between the cooling air and the radiation plates 37. As a result, the radiation plates 37 are cooled down whereas the temperature of the cooling air increases. Since the heat generated at the inverter 7 and the DC/DC converter 8 is transmitted to the radiation plates 37 in the casings 32, the inverter 7 and the DC/DC converter 8 are also cooled down when the radiation plates 37 are cooled down.

The cooling air, the temperature of which is increased due to the heat exchange between the radiation plates 37, passes into the air-exhaust duct 40 from the upper opening 32b of the casings 32 via the lower opening 42 of the air-exhaust duct 40, and then is sucked by the fan 60 via the cooling air outlet 41 of the air-exhaust duct 40. After this, the cooling air is exhausted into the trunk 3 from the outlet 61 of the fan 60 via a duct which is not shown in the figures.

According to the high voltage electrical packaging box structure of the embodiment of the present invention mentioned above, since the interposing members 200–202, which are formed using an expandable resin, are disposed within the space between the exterior box 50 and the battery box 20 in which the battery 5 is disposed, it becomes possible to provide thermal insulation around the battery 5 using the interposing members 200–202. Accordingly, adverse effects on the battery 5 may be prevented at both excessively high and low interior temperatures of the vehicle.

Also, according to the high voltage electrical packaging box structure of the embodiment of the present invention, since the interposing members 200 and 203, which are formed using an expandable resin, are disposed at the outside of the battery box 20 facing the trunk, and the outside of the heat sink case 30 facing the trunk, respectively, it becomes possible to reduce the effects of external impacts on the battery 5, and the inverter 7 and the DC/DC converter 8, which are placed in the battery box 20 and the heat sink case 30, respectively. Accordingly, if an object placed in the trunk hits the high voltage electrical packaging box body 70, it is possible to prevent damage to the battery 5, the inverter 7, and the DC/DC converter 8.

Moreover, since the battery 5 is mainly cooled down in the high voltage electrical packaging box structure according to the embodiment of the present invention by air flowing inside the electrical packaging box structure, the air can be efficiently pass through the battery 5 by filling the space using the interposing members 200–202. Accordingly, it becomes possible to efficiently cool down the battery 5.

Furthermore, since the terminal portion 206 of the battery 5 is covered by the interposing member 202 which is made of an expandable resin in the high voltage electrical packaging box structure according to the embodiment of the present invention, it becomes possible, if the interposing member 202 is attached to the battery 5 side in advance, to prevent a worker from accidentally touching the terminal portion 206 when the battery 5 is positioned in the high voltage electrical packaging box body 70 or when performing maintenance. Accordingly, it becomes possible to improve the efficiency of the battery mounting process or maintenance.

Having thus described exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A high voltage electrical packaging box structure, comprising:
    a box body;
    a high voltage electric part which is accommodated in said box body, and
    an interposing member disposed between said box body and said high voltage electric part, said interposing member being formed using an expanded resin and including bead members raised from a surface of said interposing member facing said high voltage electric part.

2. A high voltage electrical packaging box structure according to claim 1, wherein air is passed through said box body so as to cool down said high voltage electric part.

3. A high voltage electrical packaging box structure according to claim 1, wherein a terminal portion of said high voltage electric part is covered by said interposing member.

4. A high voltage electrical packaging box structure according to claim 2, wherein a terminal portion of said high voltage electric part is covered by said interposing member.

5. A high voltage electrical packaging box structure according to claim 1, wherein said high voltage electrical packaging box structure is placed between a rear seat and a trunk of a vehicle.

6. A high voltage electrical packaging box structure according to claim 1, wherein said high voltage electrical packaging box structure is operably connected to a cooling device wherein said high voltage electric part is cooled.

7. A high voltage electrical packaging box structure, according to claim 1, wherein said interposing member is attached to said high voltage electric part by a fixing means.

* * * * *